(12) United States Patent
Ishii et al.

(10) Patent No.: US 10,848,145 B2
(45) Date of Patent: Nov. 24, 2020

(54) DRIVER CIRCUIT, SWITCHING CONTROL CIRCUIT, AND SWITCHING DEVICE

(71) Applicant: PANASONIC INTELLECTUAL PROPERTY MANAGEMENT CO., LTD., Osaka (JP)

(72) Inventors: Takuya Ishii, Osaka (JP); Yoshihito Kawakami, Osaka (JP); Takahiro Uehara, Kyoto (JP); Ginga Katase, Kyoto (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 382 days.

(21) Appl. No.: 15/801,197

(22) Filed: Nov. 1, 2017

(65) Prior Publication Data

US 2018/0083610 A1 Mar. 22, 2018

Related U.S. Application Data

(63) Continuation of application No. PCT/JP2016/001738, filed on Mar. 25, 2016.

(30) Foreign Application Priority Data

May 13, 2015 (JP) .................................. 2015-098555

(51) Int. Cl.
*H03K 17/16* (2006.01)
*H02M 1/08* (2006.01)
(Continued)

(52) U.S. Cl.
CPC ............ *H03K 17/163* (2013.01); *H02M 1/08* (2013.01); *H02M 3/073* (2013.01); *H02M 3/158* (2013.01); *H03K 17/04123* (2013.01)

(58) Field of Classification Search
CPC ....... H03K 17/04106; H03K 17/04123; H03K 17/163; H03K 17/687; H03K 17/6871;
(Continued)

(56) References Cited

U.S. PATENT DOCUMENTS 6,271,708 B1 8/2001 Hoshi et al.
8,203,377 B2 * 6/2012 Kelley ............. H03K 17/04123
326/21

(Continued)

FOREIGN PATENT DOCUMENTS

JP 2000-059189 A 2/2000
JP 2009-011049 A 1/2009
(Continued)

OTHER PUBLICATIONS

International Search Report and Written Opinion issued in International Patent Application No. PCT/JP2016/001738, dated Jun. 21, 2016; with paritial English translation.

*Primary Examiner* — Patrick O Neill
(74) *Attorney, Agent, or Firm* — McDermott Will & Emery LLP

(57) ABSTRACT

A driver circuit which is supplied with a positive power supply voltage, a negative power supply voltage, and an input signal, and drives a switching element including a control terminal according to the input signal includes: a first output terminal connected to the control terminal via a first impedance circuit, and outputs the positive power supply voltage or the negative power supply voltage according to the input signal, to charge the control terminal and put the switching element into an ON state; a negative power supply terminal supplied with the negative power supply voltage; a negative voltage switch having a first end connected to the negative power supply terminal; a third output terminal connected to a second end of the negative voltage switch and to the control terminal via a second impedance circuit; and (Continued)

a first discharge switch disposed between the negative power supply terminal and the first output terminal.

17 Claims, 9 Drawing Sheets

(51) Int. Cl.
*H02M 3/158* (2006.01)
*H02M 3/07* (2006.01)
*H03K 17/0412* (2006.01)

(58) Field of Classification Search
CPC .... H03K 17/6874; H02M 1/08; H02M 3/073; H02M 3/158
See application file for complete search history.

(56) References Cited

U.S. PATENT DOCUMENTS

| | | | |
|---|---|---|---|
| 9,543,928 B2 * | 1/2017 | Yamashiro | H03K 17/168 |
| 9,755,639 B2 * | 9/2017 | Kampl | H03K 17/165 |
| 9,780,636 B2 * | 10/2017 | Deboy | H02M 1/08 |
| 2009/0002054 A1 | 1/2009 | Tsunoda et al. | |
| 2010/0301784 A1 | 12/2010 | Tagome et al. | |
| 2011/0080192 A1 | 4/2011 | Ogawa et al. | |
| 2011/0241738 A1 * | 10/2011 | Tamaoka | H03K 17/164 327/109 |
| 2013/0229208 A1 | 9/2013 | Hamanaka et al. | |

FOREIGN PATENT DOCUMENTS

| | | |
|---|---|---|
| JP | 2009-159259 A | 7/2009 |
| JP | 2010-051165 A | 3/2010 |
| JP | 2011-077462 A | 4/2011 |
| JP | 2012-227825 A | 11/2012 |
| JP | 2013-183308 A | 9/2013 |
| WO | 2010/070899 A1 | 6/2010 |
| WO | 2012/111273 A1 | 8/2012 |

* cited by examiner

Prior Art

DRIVER CIRCUIT, SWITCHING CONTROL CIRCUIT, AND SWITCHING DEVICE

CROSS REFERENCE TO RELATED APPLICATIONS

This application is a U.S. continuation application of PCT International Patent Application Number PCT/JP2016/001738 filed on Mar. 25, 2016, claiming the benefit of priority of Japanese Patent Application Number 2015-098555 filed on May 13, 2015, the entire contents of which are hereby incorporated by reference.

BACKGROUND

1. Technical Field

The present disclosure relates to a driver circuit, a switching control circuit, and a switching device.

2. Description of the Related Art

Patent Literature (PTL) 1 (Japanese Unexamined Patent Application Publication No. 2011-77462) discloses a semiconductor circuit using a normally-off junction field-effect transistor (FET) as a switching element.

FIG. 12 is a circuit diagram of a semiconductor circuit disclosed in PTL 1. The semiconductor circuit disclosed in the diagram includes: normally-off junction FET (switching element) 201; gate switching module 203; diode 213; Zener diode 214; freewheel diode 202; feedback capacitor 207; input capacitor 208; and parasitic diode 209. Junction FET 201 is disposed between drain terminal 204 and source terminal 205. Gate switching module 203 is disposed between gate terminal 206 of junction FET 201 and source terminal 205, and includes gate resistor 211, gate power supply 212 for applying a voltage to junction FET 201, and condenser 215 connected in parallel with gate resistor 211.

In the above configuration, normally-off junction FET 201 has a low voltage threshold value of 2.5 V, and the gate current is limited by gate resistor 211. Thus, normally-off junction FET 201 cannot turn on fast. Therefore, a fast turn-on is achieved by connecting condenser 215 in parallel to apply the current charged in input capacitor 208 through a path different from a path on which gate resistor 211 is present. In addition, gate resistor 211 can limit the current at the time of turn-on. In other words, since condenser 215 is charged at the time of turn-on, the voltage of condenser 215 is applied between gate terminal 206 and source terminal 205. In this condition, an erroneous operation is less likely to occur.

SUMMARY

A gallium nitride gate injection transistor (GaN-GIT) which is a semiconductor element made using gallium nitride and having a wide band gap is expected to be used practically as a fast switching element of a voltage application-current driven type (a fast switching element which is driven by a current flowing when a voltage is applied) which achieves a normally-off operation and a low ON resistance.

However, it is difficult to supply a stable driving current while adjusting a switching speed when a junction FET switching element is replaced with a GaN-GIT in the semiconductor circuit disclosed in PTL 1.

One non-limiting and exemplary embodiment provides a driver circuit, a switching control circuit, and a switching device which make it possible to achieve an adjusted fast switching speed and supply a driving current controlled stably to a fast switching element of a voltage application-current driven type.

A driver circuit according to the present disclosure is a driver circuit which is supplied with a positive power supply voltage, a negative power supply voltage, and an input signal, and drives a switching element including a control terminal according to the input signal, the driver circuit including: a first output terminal which is connected to the control terminal via a first impedance circuit, and outputs the positive power supply voltage or the negative power supply voltage according to the input signal, to charge the control terminal and put the switching element into an ON state; a negative power supply terminal which is supplied with the negative power supply voltage; a negative voltage switch having a first end connected to the negative power supply terminal; a third output terminal which is connected to a second end of the negative voltage switch, and connected to the control terminal via a second impedance circuit; and a first discharge switch disposed between the negative power supply terminal and the first output terminal.

In addition, a switching control circuit according to the present disclosure is a switching control circuit which is supplied with a positive power supply voltage and an input signal, and drives a switching element including a control terminal according to the input signal, the switching control circuit including: a first impedance circuit including a predetermined resistive element; and a current supply circuit, wherein the switching control circuit controls the switching element by supplying, to the control terminal, a first current converted from the positive power supply voltage by the first impedance circuit and a second current which is output from the current supply circuit when putting the switching element into an ON state.

The driver circuit according to the present disclosure makes it possible to achieve fast switching while adjusting turn-on time and turn-off time for the switching element of a voltage application-current driven type, which enables stable supply of a driving current.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Underlying Knowledge Forming Basis of the Present Disclosure)

The Inventors found that the switching element disclosed in the BACKGROUND section has problems indicated below.

Figure 12:
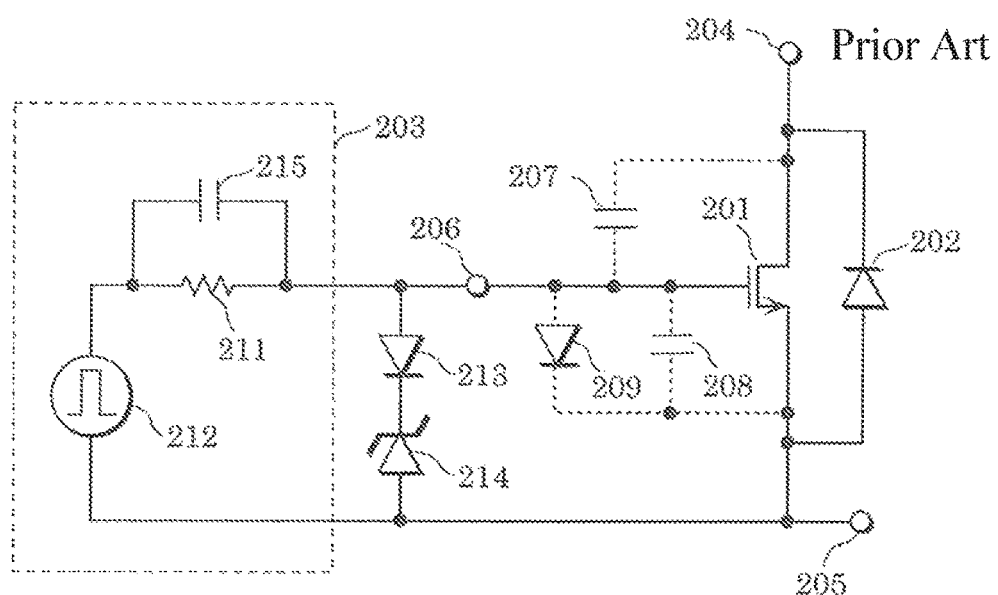
FIG. 12 is a circuit diagram of a semiconductor circuit disclosed in PTL 1.

In FIG. 12, junction FET 201 includes parasitic diode 209 in parallel with input capacitor 208 between a gate and a source (hereinafter "between a/the gate and a/the source" is also simply referred to as "gate-source"). The threshold value for turning on junction FET 201 is approximately 2.5 V, and the gate-source voltage needs to be controlled at high accuracy in order to turn on junction FET 201 with a low loss. In the semiconductor circuit disclosed in FIG. 12, the gate-source voltage is controlled by connecting diode 213 and Zener diode 214 in series between gate terminal 206 and source terminal 205 of junction FET 201. Charge and discharge of a current to and from input capacitor 208 is adjusted by gate resistor 211. Fast turn-on of junction FET 201 is achieved by condenser 215 causing the current charged in input capacitor 208 to flow through a path different from a path on which gate resistor 211 is present. In the case of OFF time, the voltage of condenser 215 charged at the time of turn-on is applied between the gate and the source as a negative voltage. This reduces a possibility that an erroneous operation of self turn-on occurs.

Such an erroneous operation of self turn-on is also referred to as breakthrough which is a phenomenon that, for example, increase in the voltage of drain terminal 204 at the time of turn-off causes the charged current to flow into feedback capacitor 207, which inevitably turns on junction FET 201. This breakthrough is likely to occur when a change speed dV/dt of the drain terminal voltage is larger and parasitic impedance is larger due to a long gate line path. In this point of view, in order to reduce such breakthrough, countermeasures such as employing a configuration for making a gate-source impedance at the time of turn-off to be low, or applying a negative voltage as described above.

However, in the conventional configuration, the switching element is a normally-off junction FET 201, and has an object to solve a problem of controlling the gate-source voltage at the time of turn-on with high accuracy. The switching element according to the present disclosure is the same as the conventional technique in that the switching element is of a voltage application-current driven type, is of a normally-off type, has a low threshold value for turn-on, and may self turn on erroneously due to a small input capacitance. The switching element according to the present disclosure, however, differs in that there is a need to control the gate current rather than the gate-source voltage at the time of turn-on.

In addition, a capacitive element such as a condenser when disposed on a path for a current for driving a switching element provides an effect of reducing driving losses while achieving fast switching by charging and discharging the gate-source capacitance fast because no current flows in most of ON periods and OFF periods. In other words, the charge and discharge of the voltage of the condenser affects the gate input current at the time of turning on the switching element, the gate output current at the time of turning off the switching element, that is, turn-on time and turn-off time. However, the charge and discharge of voltage in the condenser has a problem of being variable due to ON time, a static capacitance value of the condenser, a driving voltage, etc.

One non-limiting and exemplary embodiment provides a driver circuit, a switching control circuit, and a switching device which make it possible to achieve an adjusted fast switching speed and supply a driving current controlled stably to a fast switching element of a voltage application-current driven type.

Hereinafter, embodiments of the driver circuit, the switching control circuit, and the switching device are described.

Embodiment 1

Figure 1:
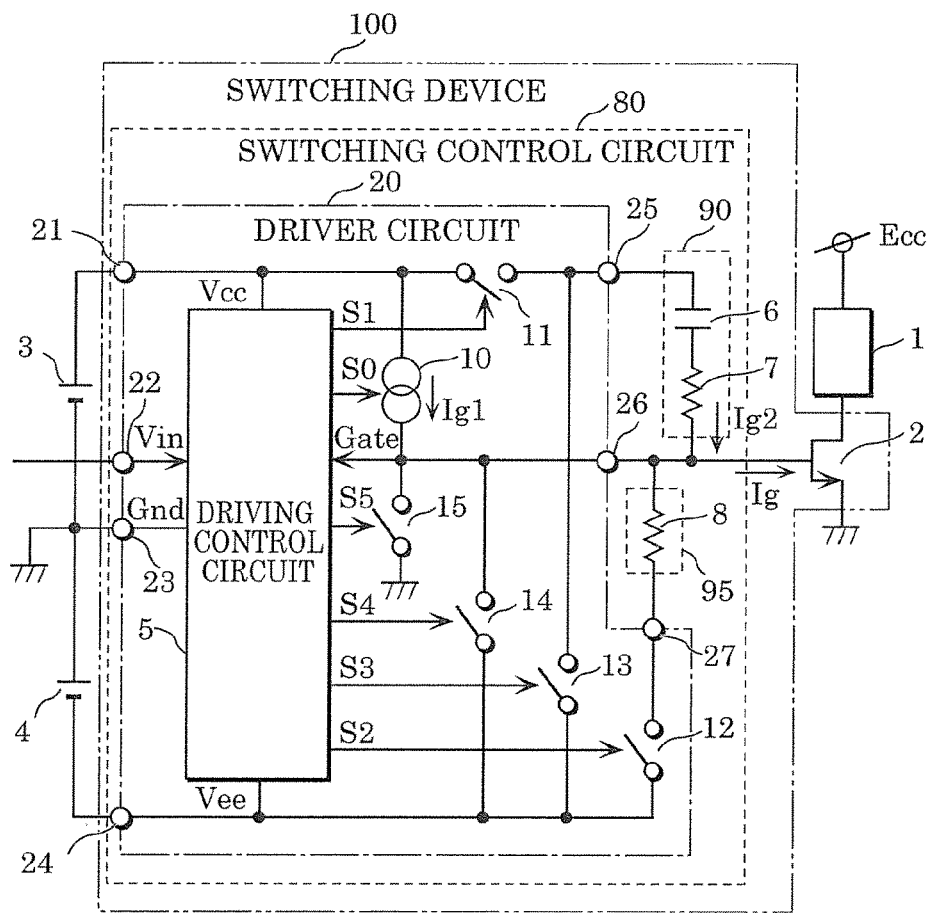
FIG. 1 is a diagram illustrating a load and a circuit configuration of a switching device according to Embodiment 1.
Figure 2:
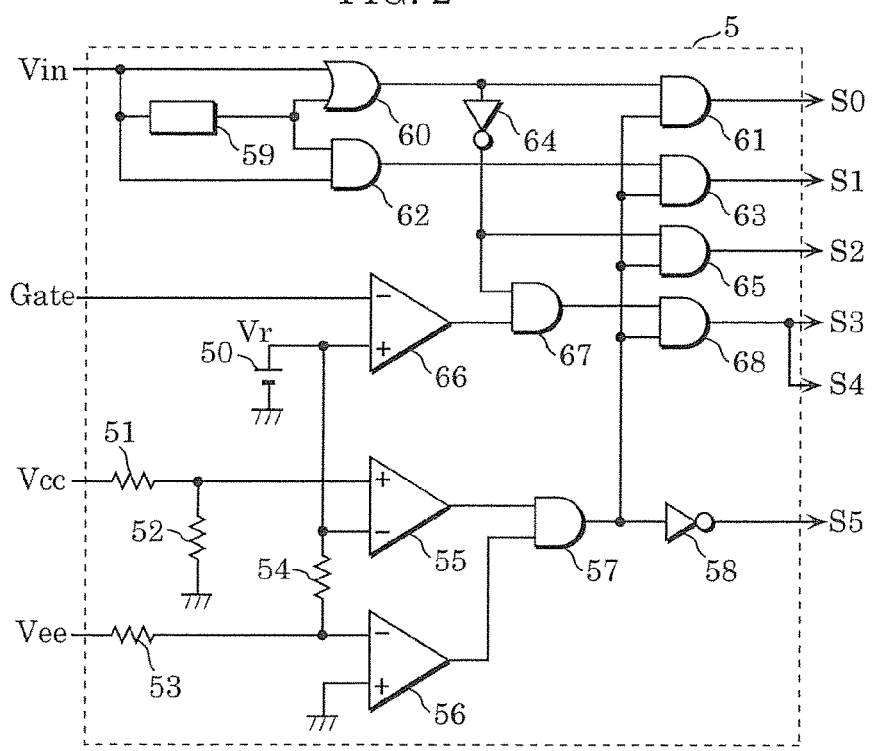
FIG. 2 is a diagram illustrating an example of a configuration of a driving control circuit.
Figure 3:
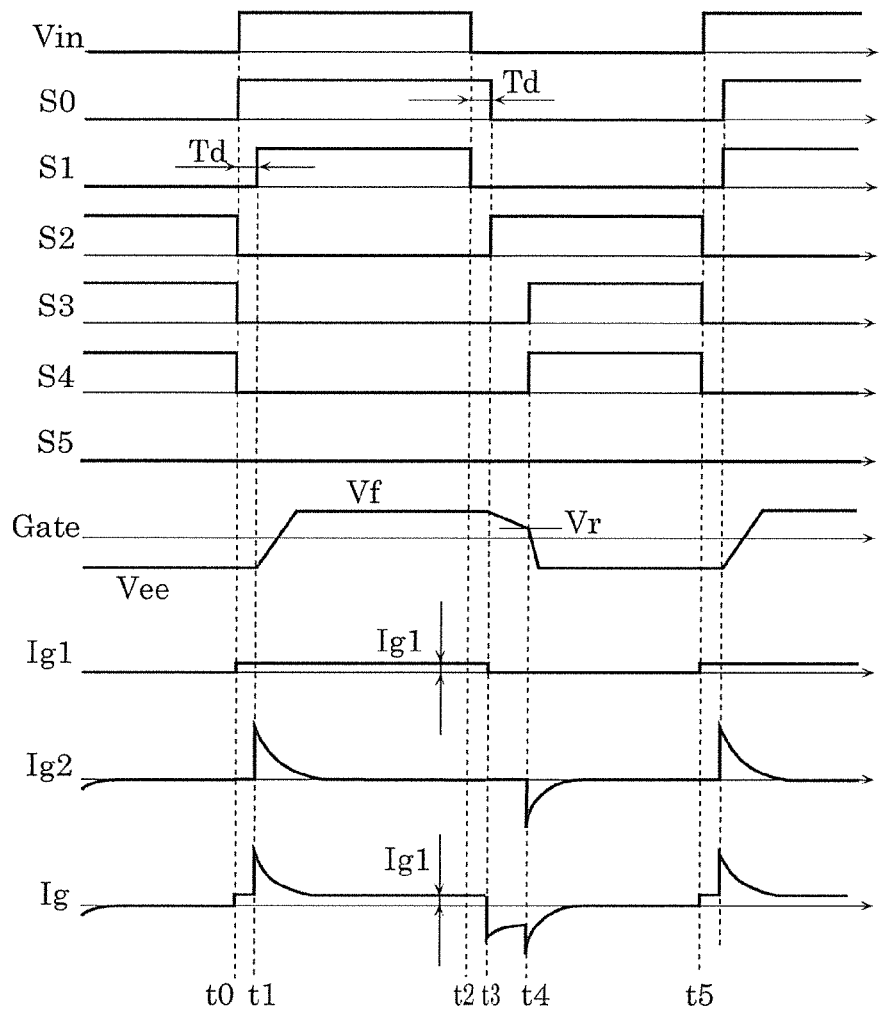
FIG. 3 is a diagram illustrating signal waveforms in the switching device according to Embodiment 1.

FIG. 1 is a diagram illustrating load 1 and a circuit configuration of switching device 100 according to Embodiment 1. FIG. 2 is a diagram illustrating an example of a configuration of driving control circuit 5. FIG. 3 is a diagram illustrating signal waveforms in switching device 100 according to Embodiment 1.

[1-1. Configuration of Switching Device]

In FIG. 1, switching device 100 includes switching element 2 and switching control circuit 80. Switching element 2 includes a first terminal which is a drain terminal, a second terminal which is a source terminal, and a control terminal which is a gate terminal. Switching element 2 is a switching element of a voltage application-current driven type, and is for example a GaN-GIT. Turning on or off of switching element 2 applies pulsed power supply voltage Ecc to load 1.

In addition, current Ig denotes an input current to the gate terminal of switching element 2. Current Ig1 and current Ig2 are to be supplied when current Ig is plus, and are to be discharged when current Ig is minus.

Switching control circuit 80 is a circuit which controls an application state of power supply voltage Ecc to load 1, and includes driver circuit 20, first impedance circuit 90, and second impedance circuit 95. More specifically, switching control circuit 80 controls switching of switching element 2 which switches between application and non-application of power supply voltage Ecc to load 1.

Driver circuit 20 includes: driving control circuit 5; current supply circuit 10; first switch 11; second switch 12; third switch 13; fourth switch 14; fifth switch 15; positive power supply terminal 21; input terminal 22; ground terminal 23; negative power supply terminal 24; first output terminal 25; second output terminal 26; and third output terminal 27. Driver circuit 20 is an integrated circuit which is mainly made of a semiconductor material. It is to be noted that integration (on a chip) of driver circuit 20 is not limited to the circuit configuration of driver circuit 20 illustrated in FIG. 1, and may be arbitrarily changed according to requirement characteristics etc. (for example, size reduction, reduction in power consumption, cost, etc.) of switching control circuit 80 and switching device 100.

Positive power supply terminal 21 is supplied with positive voltage Vcc which is a power supply voltage from positive power supply 3, and negative power supply terminal 24 is supplied with negative voltage Vee from negative power supply 4.

Input terminal 22 receives driving pulse signal Vin which is an input signal.

First output terminal 25 is a terminal capable of outputting positive voltage Vcc supplied to switching control circuit 80 according to input signal Vin.

Second output terminal 26 is a terminal connected to current supply circuit 10 and different from first output terminal 25.

Third output terminal 27 is a terminal connected to the other end of second switch 12 and to the gate terminal via second impedance circuit 95.

Driving control circuit 5 receives driving pulse signal Vin via input terminal 22, and outputs signals S0 to S5 respectively via terminals S0 to S5. Current supply circuit 10 supplies constant current Ig1 to the gate terminal of switching element 2 via second output terminal 26 when signal S0 is at level H.

First switch 11 has a first end connected to positive power supply terminal 21, and is put into an ON state when signal S1 is at level H. Second switch 12 is a negative voltage switch having a first end connected to negative power supply terminal 24, and is put into an ON state when signal S2 is at level H. Third switch 13 is a first discharge switch connected between the second end of first switch 11 and negative power supply terminal 24, and is put into an ON state when signal S3 is at level H. Fourth switch 14 is a second discharge switch connected between the gate terminal of switching element 2 and negative power supply terminal 24, and is put into an ON state when signal S4 is at level H. Fifth switch 15 is connected between the gate terminal of switching element 2 and a Gnd terminal, and is put into an ON state when signal S5 is at level H.

First impedance circuit 90 includes condenser 6 and first resistor 7. Condenser 6 and first resistor 7 connected to each other in series are connected between the other end of first switch 11 and the gate terminal of switching element 2. It is to be noted that first impedance circuit 90 may include a circuit element other than first resistor 7 and condenser 6.

Second impedance circuit 95 includes second resistor 8. Second resistor 8 is connected between the other end of second switch 12 and the gate terminal of switching element 2. It is to be noted that second impedance circuit 95 may include a circuit element other than second resistor 8.

As illustrated in FIG. 2, driving control circuit 5 includes: reference voltage supply 50; resistors 51 to 54; comparators 55, 56, and 66; AND circuits 57, 61 to 63, 65, 67, and 68; OR circuit 60; inverters 58 and 64; and delay circuit 59.

Reference voltage supply 50 generates reference voltage Vr. Resistors 51 and 52 divide positive voltage Vcc. Resistors 53 and 54 divide the difference voltage between negative voltage Vee and reference voltage Vr. Comparator 55 compares the divided voltage value of positive voltage Vcc and reference voltage Vr, and outputs level "H" to AND circuit 57 when positive voltage Vcc is larger than or equal to a predetermined value. Comparator 56 compares the values of voltages divided from the difference voltage between negative voltage Vee and reference voltage Vr, and outputs level "H" to AND circuit 57 when negative voltage Vee is smaller than or equal to a predetermined value. Inverter 58 inverts an output from AND circuit 57 and outputs the inverted output as signal S5. Delay circuit 59 outputs input signal Vin to OR circuit 60 and AND circuit 62 with delay time Td. OR circuit 60 receives input signal Vin and an output from delay circuit 59. AND circuit 61 receives an output from OR circuit 60 and the output from AND circuit 57, and outputs signal S0. AND circuit 62 receives input signal Vin and the output from delay circuit 59. AND circuit 63 receives an output from AND circuit 62 and the output from AND circuit 57, and outputs signal S1. Inverter 64 inverts the output from OR circuit 60. AND circuit 65 receives an output from inverter 64 and the output from AND circuit 57, and outputs signal S2. Comparator 66 compares the gate voltage and reference voltage Vr, and outputs level "H" to AND circuit 67 when the gate voltage is lower than reference voltage Vr. AND circuit 67 receives the output from inverter 64 and the output from comparator 66. AND circuit 68 receives an output from AND circuit 67 and the output from AND circuit 57, and outputs signals S3 and S4.

[1-2. Operations Performed by Switching Control Circuit]

First, operations performed in the case where switching control circuit 80 is stopped are described. Here, the case where switching control circuit 80 is stopped is the case where positive voltage Vcc is lower than the predetermined value, or the case where negative voltage Vee is higher than the predetermined value, in other words, the case where switching control circuit 80 cannot fully turn on or off switching element 2. In this case, even when input signal Vin is input to switching control circuit 80, there is a need to stop switching control circuit 80. It is to be noted that the case where switching control circuit 80 is stopped may be a case other than the case where positive voltage Vcc is lower than the predetermined value, or the case where negative voltage Vee is higher than the predetermined value. Examples of other cases include a case where ambient temperature is abnormally high, or a case where a remote signal is input from outside. Here, in order to facilitate the understanding of the present disclosure, other cases where switching control circuit 80 is stopped is not listed further.

Comparator 55 outputs the result of detection and comparison of positive voltage Vcc, and Comparator 56 outputs the result of detection and comparison of negative voltage Vee. In this case, when AND circuit 57 which calculates the logical product of outputs from comparators 55 and 56 outputs level "H", switching control circuit 80 can operate. However, when AND circuit 57 outputs level "L", switching control circuit 80 stops operating. In other words, signal S5 which is an inverse signal of the output from AND circuit 57 is set to level "H" when switching control circuit 80 stops operating, which puts fifth switch 15 into an ON state to cause a ground fault of the gate of switching element 2. At the same time, level "L" outputs from AND circuit 57 are input to AND circuits 61, 63, 65, and 68 to cause signals S0 to S4 corresponding to the respective outputs to be level "L" and to put, into an OFF state, corresponding current supply circuit 10, first switch 11, second switch 12, third switch 13, and fourth switch 14.

Next, operations performed by switching control circuit 80 are described with reference to FIGS. 1 to 3.

The respective signal waveforms in FIG. 3 indicate that signal S5 is in a level-"L" operation state, in other words, that switching control circuit 80 is operating.

First, when input signal Vin rises (to level "H") at time t0 in FIG. 3, the level "L" signal is input to AND circuits 65 and 67 by inverter 64. In this way, signals S2 to S4 which are outputs from AND circuits 65 and 68 are inverted from level "H" to level "L", and second switch 12, third switch 13, and fourth switch 14 turn off. At the same time, signal S0 output via OR circuit 60 and AND circuit 61 is set to level "H". Current supply circuit 10 starts to supply constant current Ig1 to the gate terminal of switching element 2.

Constant current Ig1 charges the gate-source capacitance of the gate terminal of switching element 2 connected to negative power supply Vee. This current is set to several to several tens of mA, and the potential of the gate terminal does not substantially change from negative voltage Vee.

Next, at time t1 after delay time Td by delay circuit 59, the output from AND circuit 62 is set to level "H", and thus signal S1 is also set to level "H", which turns on first switch 11. First impedance circuit 90 which is a series circuit of condenser 6 and first resistor 7 receives application of positive voltage Vcc, and surge current Ig2 is supplied to the gate terminal of switching element 2 via first impedance circuit 90 to charge gate capacitance. The GaN-GIT assumed to be switching element 2 is put into an ON state when the gate-source voltage exceeds a threshold voltage value determined according to element performances. This transition period can be adjusted by a resistance value of first resistor 7.

Subsequently, during an ON period of switching element 2, the gate-source voltage of the GaN-GIT is clamped at forward voltage Vf, and thus supply of current Ig2 from the series circuit of condenser 6 and first resistor 7 stops. Although a gate input current is required to maintain the ON state of the low ON resistance, the gate input current is obtained as constant current Ig1 from current supply circuit 10.

Next, at time t2, when input signal Vin inverts from level "H" to level "L", the output from AND circuit 62 is set to level "L", which sets signal S1 to level "L" and turns off first switch 11.

Next, at time t3 after delay time Td by delay circuit 59, the outputs from OR circuit 60 and AND circuit 61 are set to level "L", and current supply circuit 10 stops supplying the current. At the same time, signal S2 which is the output from AND circuit 65 is set to level "H", and second switch 12 turns on. The gate terminal of switching element 2 is connected to the negative voltage terminal of negative power supply 4 via second resistor 8 and second switch 12, and discharges gate capacitance. This discharge speed can be adjusted by a resistance value of second resistor 8.

Next, at time t4, when a gate terminal voltage of switching element 2 decreased due to the discharge decreases to reference voltage Vr or below, the output from comparator 66 inverts from level "L" to level "H", and signals S3 and S4 output via AND circuits 67 and 68 are set to level "H". Fourth switch 14 turns on according to signal S4, and the gate terminal of switching element 2 is connected to negative power supply terminal 24. Accompanied by this, third switch 13 turns on according to signal S3, and condenser 6 is discharged via first resistor 7, third switch 13, and fourth switch 14. Third switch 13 turns on and off in synchronization with second switch 12. More specifically, third switch 13 is put into a conduction state after an elapse of predetermined time from when second switch 12 is put into a conduction state in the case where switching element 2 is put into an OFF state. The period starting from time t4 is an OFF period in which switching element 2 is OFF. Since the gate terminal is connected to the negative power supply with a low impedance, it is possible to prevent an erroneous operation of self turn-on from occurring due to variation in drain voltage.

Third switch 13 and fourth switch 14 are discharge switches for discharging charge accumulated in first impedance circuit 90 by being put into a conduction state when switching element 2 is put into an OFF state.

Next, input signal Vin rises again (is set to level "H") at time t5, and the above operations are repeated.

Although each of the period from time t0 to t1 and the period from time t2 to t3 is set as delay time Td, it is to be noted that the period is dead time for preventing short circuit between positive power supply 3 (positive voltage Vcc) and negative power supply 4 (negative voltage Vee) when first switch 11 to fourth switch 14 are switched on or off, and that the period is desired to be minimum.

According to the configuration and operations, driver circuit 20 drives switching element 2 by supplying, to the gate terminal, current Ig2 which is a first current converted from positive voltage Vcc output from first output terminal 25 by first impedance circuit 90 and current Ig1 which is a second current output via second output terminal 26 from current supply circuit 10.

As described above, in driver circuit 20 according to this embodiment, the current path for charging the gate terminal of switching element 2 is divided to a fast charging path that passes through first impedance circuit 90 which is a CR series circuit of a condenser and a resistor and a gate current control path that passes through current supply circuit 10. In this way, it is possible to adjust transition time and change the voltage and current rates (through rates) at the time of turn-on, and secure a stable ON state indicating a low ON resistivity. In addition, setting a negative power supply sets the gate voltage at the time of turn-off to a negative voltage. In this way, it is possible to prevent an erroneous operation such as self turn-on. Furthermore, two or more system driving paths (fourth switch 14 and second impedance circuit 95) having different resistance values are provided as connection paths to the negative power supply at the time of turn-off. In this way, it is possible to adjust transition time, and change the voltage and current rates (through rates) at the time of turn-off, and, since condenser 6 on the driving path is discharged, to wait turn-on always under the same conditions.

In addition, switching control circuit 80 according to this embodiment includes: first impedance circuit 90; and current supply circuit 10, and controls switching element 2 by supplying, to the gate terminal, current Ig2 converted from positive voltage Vcc by first impedance circuit 90 and current Ig1 output from current supply circuit 10 when switching element 2 is put into an ON state. Switching control circuit 80 includes the following paths selectively used when putting switching element 2 into an OFF state: a path on which a gate terminal, second impedance circuit 95, third output terminal 27, second switch 12, and negative power supply terminal 24 are present for putting second switch 12 into a conduction state to discharge the gate terminal; and a path on which a gate terminal, second output terminal 26, fourth switch 14, and negative power supply 24 are present for putting fourth switch 14 into a conduction state to discharge the gate terminal. In this way, similar effects obtainable in the above driver circuit 20 are provided.

In addition, switching device 100 according to this embodiment includes switching control circuit 80 and switching element 2. In this way, similar effects obtainable in the above driver circuit 20 and switching control circuit 80 are provided.

It is to be noted that, when the capacitance value of condenser 6 is Cs, and the gate-source capacitance of switching element 2 is Cgs, the condition for Cs in order that the gate-source voltage of switching element 2 reaches forward voltage Vf in the gate current via condenser 6 is represented by Expression 1.

$$Cs > Cgs \times (Vf - Vee)/(Vcc - Vf) \quad (1)$$

In addition, when a resistance value of first resistor 7 is Rs, end-to-end voltage Vc of condenser 6 during an OFF period of switching element 2 is represented by Expression 2.

$$Vc = (Vcc - Vf) \times \exp[-t/(Cs \times Rs)] \quad (2)$$

According to Expression 2, it is only necessary that time constant Cs×Rs be one-third or below in order to discharge condenser 6 during Toff down to 5% or below of the charged voltage (Vcc−Vf). In other words, when the minimum value of the OFF period of switching element 2 is Toff min, the condition for Rs is represented by Expression 3.

$$Rs < Toff\_min/(3Cs) \quad (3)$$

The negative power supply has been described as a constant power supply which supplies negative voltage Vee, but is not limited to such a constant power supply. As another implementation, for example, it is possible to generate constant voltage Vdd by a series regulator from control circuit power supply Vcc as in FIG. 4, and to convert constant voltage Vdd to negative potential by an inverse switched capacitor converter.

Figure 4:
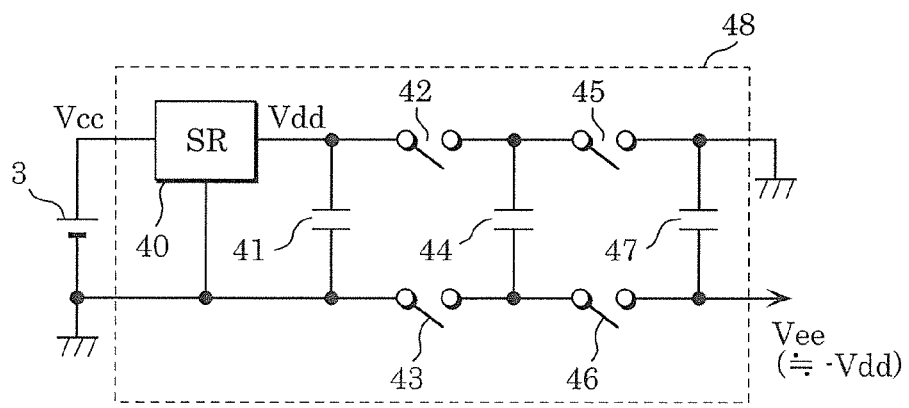
FIG. 4 is a diagram of a negative power supply circuit according to a variation of Embodiment 1.

FIG. 4 is a diagram of a negative power supply circuit according to a variation of Embodiment 1. In the diagram, negative power supply circuit 48 includes series regulator 40, condensers 41, 44, and 47, and switches 42, 43, 45, and 46. Negative power supply circuit 48 reduces input positive voltage Vcc to predetermined voltage Vdd and outputs reduced positive voltage Vcc to condenser 41. Switches 42 and 43 turn on and off at the same time, and switches 45 and 46 turn on and off exclusively from switches 42 and 43. Condenser 44 is charged to voltage Vdd when switches 42 and 43 are ON. When switches 45 and 46 are ON, the charge in condenser 44 is discharged to condenser 47. In this way, when ON and OFF periods are sufficient, voltage Vdd occurs in condenser 47, and the positive potential side thereof is connected to Gnd. Thus, voltage Vdd is inversed to negative voltage Vee, and negative voltage Vee is output. As described above, since constant voltage Vdd generated by series regulator 40 is output as negative voltage Vee (=−Vdd) by the inverse type switched capacitor converter, negative voltage Vee is a constant voltage less affected by variation of parameters such as power supply voltage Vcc etc. Making negative voltage Vee to be a constant voltage facilitates design of switching control circuit 80 such as settings of constants Cs and Rs.

Although current supply circuit 10 has been described as a circuit for supplying a predetermined current according to signal S0, it is to be noted that making the predetermined current value to be adjustable increases design flexibility and versatility. It is possible to provide driver circuit 20 with an adjustment terminal (not illustrated) for adjusting the current value of current supply circuit 10 using, for example, the value of a resistor connected to the adjustment terminal.

Embodiment 2

Figure 5:
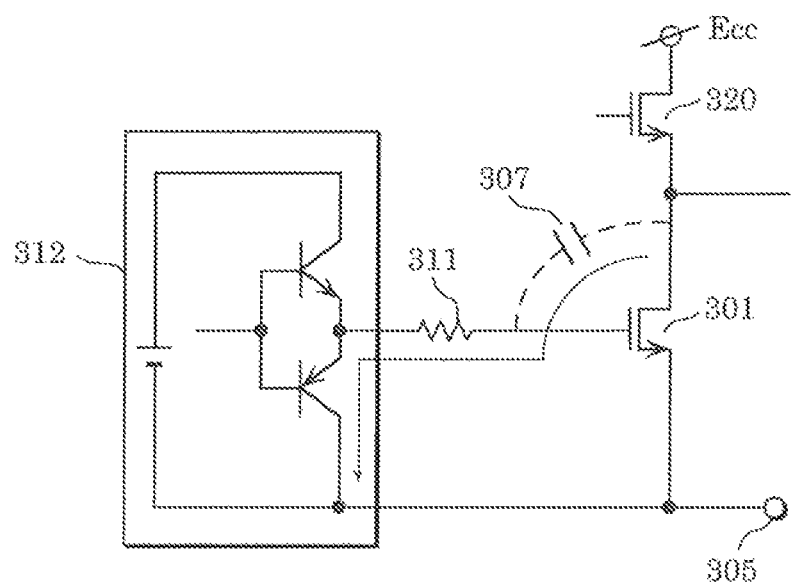
FIG. 5 is a circuit diagram for illustrating a self turn-on phenomenon of a conventional switching device disclosed in PTL 2 (PCT International Application Publication No. 2010/070899)

FIG. 5 is a circuit diagram for illustrating a self turn-on phenomenon of a conventional switching device disclosed in PTL 2. The diagram illustrates a general bridge configuration in which high-side switch 320 and low-side switch 301 are connected in a cascade. In this configuration, turning on high-side switch 320 causes a charge current to flow into drain-gate parasitic capacitor 307 of low-side switch 301, resulting in increase in the gate voltage of low-side switch 301, and low-side switch 301 may self turn on. Likewise a conventional switching device, a switching device including a fast switching element having either (i) a low threshold voltage for a gate-source on-voltage or (ii) a large drain-gate parasitic capacitance and a small gate-source input capacitance entails a problem of being likely to self turn on.

Switching device 110 according to this embodiment was made in view of the above conventional switching device.

Switching device 110 according to Embodiment 2 has a circuit configuration for enabling switching of the high-side switching element and the low-side switching element connected in the cascade. Hereinafter, switching device 110 according to this embodiment is described focusing on differences from Embodiment 1, and the same constituent elements as those in Embodiment 1 are not described repeatedly.

Figure 6:
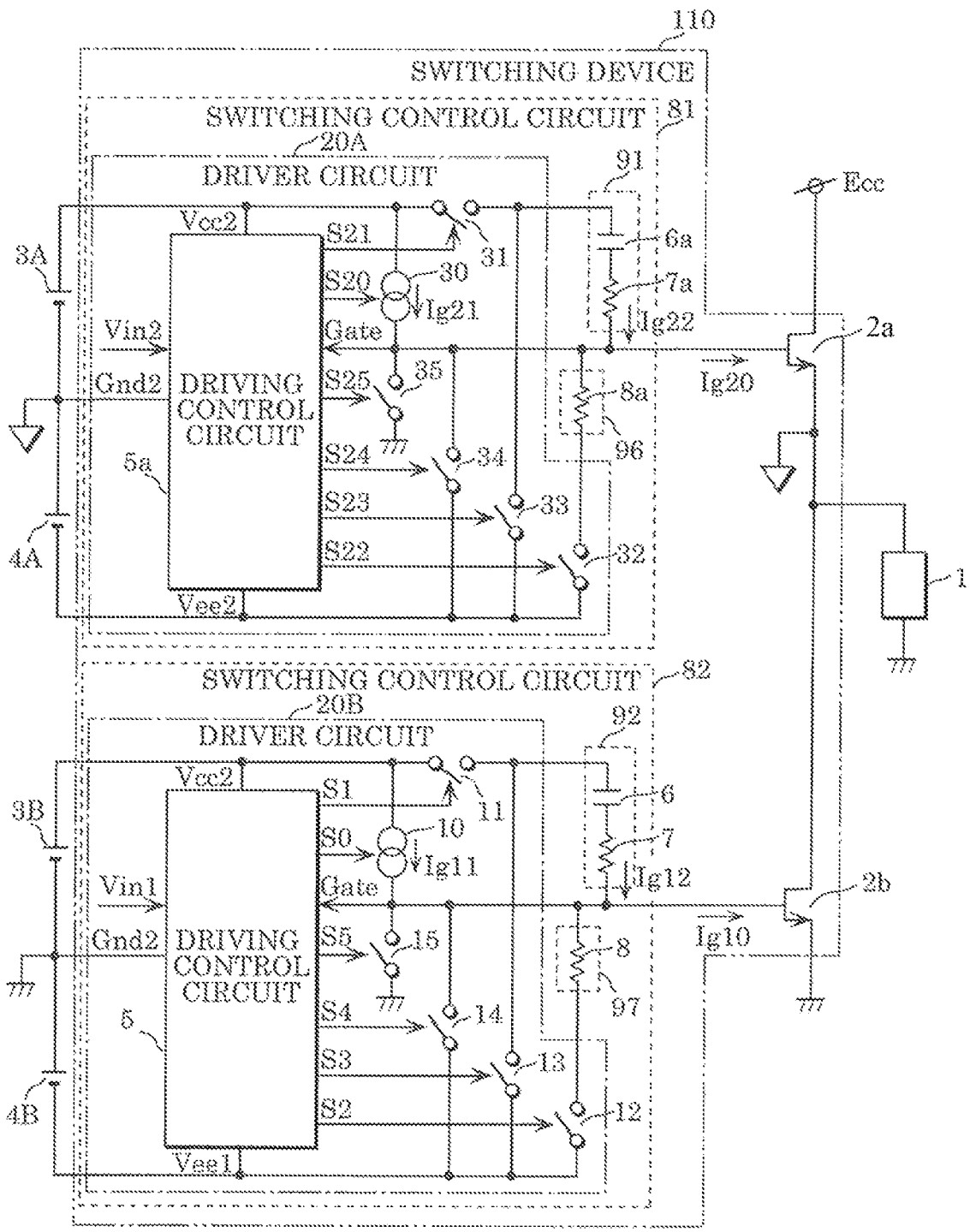
FIG. 6 is a diagram illustrating a load and a circuit configuration of a switching device according to Embodiment 2.
Figure 7:
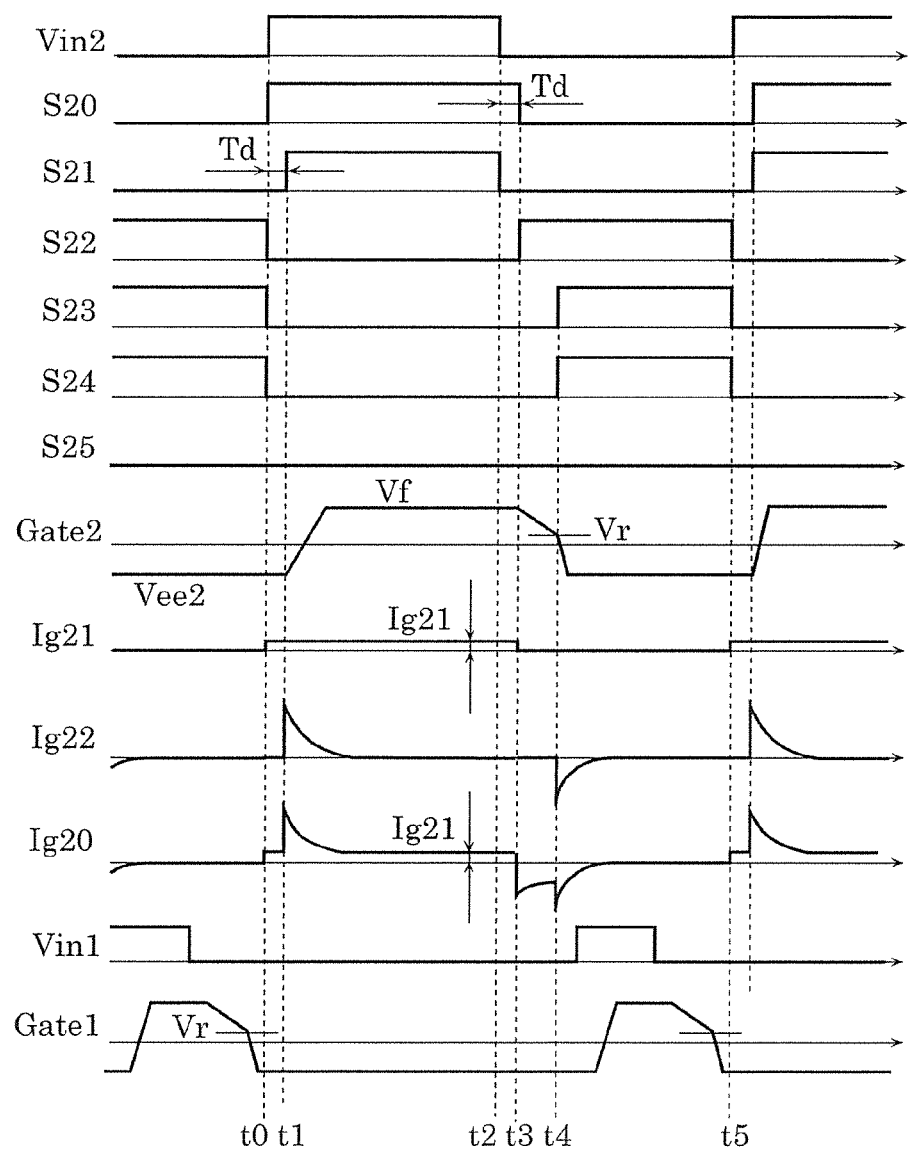
FIG. 7 is a diagram illustrating signal waveforms in the switching device according to Embodiment 2.

FIG. 6 is a diagram illustrating load 1 and the circuit configuration of switching device 110 according to Embodiment 2. FIG. 7 is a diagram illustrating signal waveforms in switching device 110 according to Embodiment 2.

[2-1. Configuration of Switching Device]

In FIG. 6, switching device 110 includes switching elements 2a and 2b and switching control circuits 81 and 82. Switching elements 2a and 2b are GaN-GITs. Turning on or off of switching elements 2a and 2b applies pulsed power supply voltage Ecc to load 1.

In addition, current Ig20 denotes an input current to the gate terminal of switching element 2a. Current Ig21 and current Ig22 are to be supplied when current Ig20 is plus, and are to be discharged when current Ig20 is minus.

Furthermore, current Ig10 denotes an input current to the gate terminal of switching element 2b. Current Ig11 and current Ig12 are to be supplied when current Ig10 is plus, and are to be discharged when current Ig10 is minus.

Switching control circuits 81 and 82 are circuits for controlling an application state of power supply voltage Ecc to load 1. Switching control circuit 81 includes driver circuit 20A, first impedance circuit 91, and second impedance circuit 96. In addition, switching control circuit 82 includes driver circuit 20B, first impedance circuit 92, and second impedance circuit 97.

The source of switching element 2a and the drain of switching element 2b are connected, the drain of switching element 2a is connected to a power supply terminal (power supply voltage Ecc), and the source of switching element 2b is connected to a Gnd terminal. The gate of switching element 2a is connected to driver circuit 20A, and the gate of switching element 2b is connected to driver circuit 20B. With this connection configuration, switching element 2a functions as a high-side switch, and switching element 2b functions as a low-side switch.

Driver circuit 20A has the same configuration as that of driver circuit 20 according to Embodiment 1, and includes driving control circuit 5a, current supply circuit 30, first switch 31, second switch 32, third switch 33, fourth switch 34, and fifth switch 35. Driver circuit 20B has the same configuration as that of driver circuit 20 according to Embodiment 1, and includes driving control circuit 5, current supply circuit 10, first switch 11, second switch 12, third switch 13, fourth switch 14, and fifth switch 15.

First switch 31 has a first end connected to the positive voltage terminal of positive power supply 3A, and is put into an ON state when signal S21 is at level H. Second switch 32 has a first end connected to the negative voltage terminal of negative power supply 4A, and is in an ON state when signal S22 is at level H. Third switch 33 is connected between the other end of first switch 31 and the negative voltage terminal of negative power supply 4A, and is put into an ON state when signal S23 is at level H. Fourth switch 34 is connected to the gate terminal of switching element 2a and the negative voltage terminal of negative power supply 4A, and is put into an ON state when signal S24 is at level H. Fifth switch 35 is connected between the gate terminal of switching element 2a and a Gnd terminal, and is put into an ON state when signal S25 is at level H.

First impedance circuit 91 includes condenser 6a and first resistor 7a. Condenser 6a and first resistor 7a connected to each other in series are connected between the other end of first switch 31 and the gate terminal of switching element 2a. It is to be noted that first impedance circuit 91 may include a circuit element other than first resistor 7a and condenser 6a.

Second impedance circuit 96 includes second resistor 8a. Second resistor 8a is connected between the other end of second switch 32 and the gate terminal of switching element 2a. It is to be noted that second impedance circuit 96 may include a circuit element other than second resistor 8a.

Driving control circuit 5a has the same configuration as that of driving control circuit 5 according to Embodiment 1.

In other words, for example, switching control circuit 80 described in Embodiment 1 can be used as each of switching control circuits 81 and 82. Although switching control circuits 81 and 82 have been described as having the same circuit configuration, it is to be noted that switching control circuits 81 and 82 may have different circuit configurations.

In this embodiment, switching element 2b and switching element 2a alternately turns on and off. Input signals Vin2 and Vin1 are input to switching control circuits 81 and 82 with dead time in which switching element 2b and switching element 2a are both in OFF states in order to prevent switching element 2b and switching element 2a from being put into ON states at the same time. In other words, settings are made so that switching element 2a is ON during an OFF period in which switching element 2b is OFF and switching element 2b is ON during an OFF period in which switching element 2a is OFF.

[2-2. Operations Performed by Switching Control Circuit]

Operations performed when switching control circuits 81 and 82 are stopped are the same as the operations performed when switching control circuit 80 according to Embodiment 1 is stopped, and thus are not described repeatedly.

Next, operations performed by switching control circuits 81 and 82 are described with reference to FIGS. 6 and 7.

The respective signal waveforms in FIG. 7 indicate that signal S25 is in a level-"L" operation state, in other words, that switching control circuit 81 is operating.

First, at time t0 in FIG. 6, input signal Vin2 of switching control circuit 81 rises (to level "H"). In this way, signals S22 to S24 are inverted from level "H" to level "L", and first switch 32, second switch 33, and third switch 34 turn off. At the same time, signal S20 is set to level "H", and current supply circuit 30 starts to supply constant current Ig21 to switching element 2a. Constant current Ig21 charges the gate-source capacitance of the gate terminal of switching element 2a connected to negative power supply 4A. This current is set to several or several tens of mA, and potential Gate2 of the gate terminal does not substantially change from negative voltage Vee2. It is to be noted that, at this time, input signal Vin1 of switching control circuit 82 is already at level "L", and the gate-source voltage of switching element 2b is decreased to negative power supply voltage Vee1.

Next, at time t1 after delay time Td, signal S21 is set to level "H", which turns on first switch 31. First impedance circuit 91 which is a series circuit of condenser 6a and first resistor 7a receives positive voltage Vcc2, and surge current Ig22 is supplied to the gate terminal of switching element 2a via first impedance circuit 91 to charge gate capacitance. The GaN-GIT assumed to be switching element 2a is put into an ON state when the gate-source voltage exceeds a threshold voltage value determined according to element performances. This transition period can be adjusted by a resistance value of first resistor 7a.

Subsequently, during an ON period of switching element 2a, the gate-source voltage of the GaN-GIT is clamped at forward voltage Vf, and thus supply of current Ig22 from the series circuit of condenser 6a and first resistor 7a stops. Although the gate input current is required to maintain the ON state of the low ON resistance, the gate input current is obtained as constant current Ig21 from current supply circuit 30.

Next, when input signal Vin2 is inversed from level "H" to level "L" at time t2, signal S21 is set to level "L", which turns off first switch 31. At this time, input signal Vin1 of switching control circuit 82 is also at level "L", and the period from this point of time to a point of time at which Vin1 is set to level "H" next is dead time between input signals Vin1 and Vin2.

Next, when signal S20 is inversed to level "L" at time t3 after dead time Td, current supply circuit 30 stops supplying the current. Signal S22 is set to level "H" at the same time, which turns off second switch 32. The gate terminal of switching element 2a is connected to the negative voltage terminal (negative voltage Vee2) of negative power supply 4A via second resistor 8a and second switch 32, and gate capacitance is discharged gradually. This discharge speed can be adjusted by a resistance value of second resistor 8a.

Next, when the gate terminal voltage of switching element 2a decreasing due to discharge decreases to reference voltage Vr or below at time t4, signals S23 and S24 are set to level "H". Fourth switch 34 turns on according to signal S24, and the gate terminal of switching element 2a is connected to negative voltage terminal (negative voltage Vee2) of negative power supply 4A. Accompanied by this, third switch 33 turns on according to signal S23, and condenser 6a is discharged via first resistor 7a, third switch 33, and fourth switch 34. The period from time t4 to time t5 described later is an OFF period of switching element 2a, input signal Vin1 is at level "H" during this period, and switching element 2b is driven. Connection point potential Gnd 2 changes accompanied by an ON operation of switching element 2b. The gate terminal of switching element 2a is connected to negative power supply 4A at a low impedance, and thus an erroneous operation of self turn-on is prevented. It is to be noted that there is a need to adjust the dead time of an input signal or the period from t2 to t4 so that input signal Vin1 is inverted to level "L" at or before time t5 and switching element 2b has already been in an OFF state.

Next, at time t5 at which input signal Vin1 is set to level "L", input signal Vin2 rises again and the above operation is repeated. Although the period from time t0 to t1 and the period from time t2 to t3 are set as delay time Td, it is to be noted that each of the periods is dead time for preventing short circuit between positive power supply 3A (positive voltage Vcc2) and negative power supply 4A (negative voltage Vee) when first switch 31 to fourth switch 34 are switched on or off, and that the period is desired to be minimum.

As described above, according to this embodiment, the current path for charging the gate terminals of two switching elements 2a and 2b which alternately turn on and off is divided to the fast charging path that passes through first impedance circuits 91 and 92 which are the CR series circuit and the gate current control path that passes through current supply circuits 30 and 10. In this way, it is possible to adjust transition time and change the voltage and current rates (through rates) at the time of turn-on, and secure a stable ON state indicating a low ON resistivity. In addition, setting a negative power supply sets the gate voltage at the time of turn-off to a negative voltage. In this way, even when the potential at the connection point changes due to an ON operation of the other switching element during the OFF period, it is possible to prevent an erroneous operation such as self turn-on. Furthermore, driving paths of two or more systems having different resistance values are provided as connection paths to the negative power supply at the time of turn-off. In this way, it is possible to adjust transition time, and change the voltage and current rates (through rates) at the time of turn-off, and, since condensers 6a and 6 on the driving paths are discharged, to wait turn-on always under the same conditions.

Although negative power supply 4A of switching control circuit 81 has been simply described as a constant voltage source, it is also possible to generate constant voltage Vdd by a series regulator, and to cause an inverse type switched capacitor converter to convert constant voltage Vdd into a negative potential in the same manner as in the variation of Embodiment 1 illustrated in FIG. 4.

Embodiment 3

In Embodiment 1, fast charging of the gate terminals is performed only using the driving path via the first impedance circuit that is the CR series circuit. However, switching control circuits according to this embodiment can perform another fast charging method different from the method in Embodiment 1. When the absolute value of negative power supply potential Vee is large and the gate capacitance of switching element 2 is large, the charged current from the driving path via the first impedance circuit is large when supply of the current is started, but decreases exponentially as charging of the gate capacitance and the driver condenser progresses. For this reason, the charged current decreases before the gate voltage reaches to the threshold value for turn-on of switching element 2, which may disable fast turn-on. This embodiment can utilize another gate driver path in addition to the first impedance circuit.

Hereinafter, a driver circuit, a switching control circuit, and a switching device according to Embodiment 3 are described focusing on differences from driver circuit 20, switching control circuit 80, and switching device 100 according to Embodiment 1.

Figure 8:
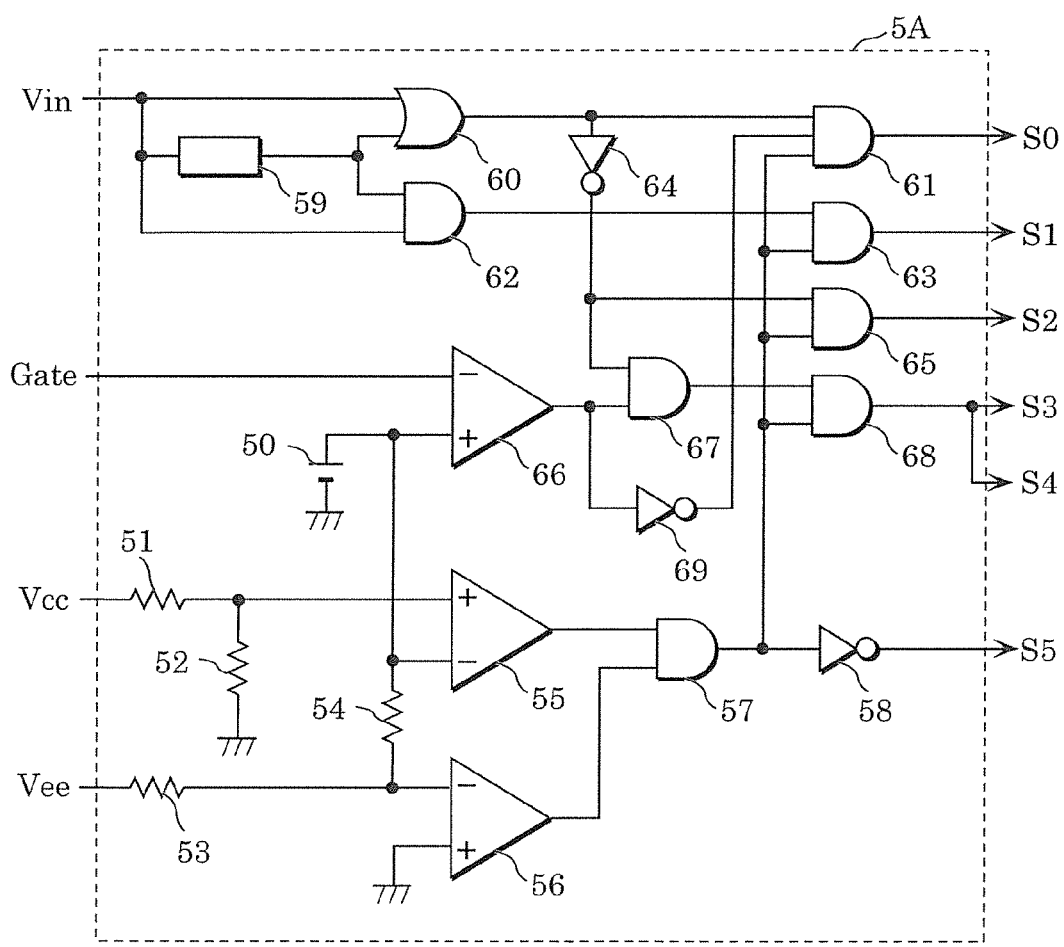
FIG. 8 is a circuit diagram of a driving control circuit according to Embodiment 3.
Figure 9:
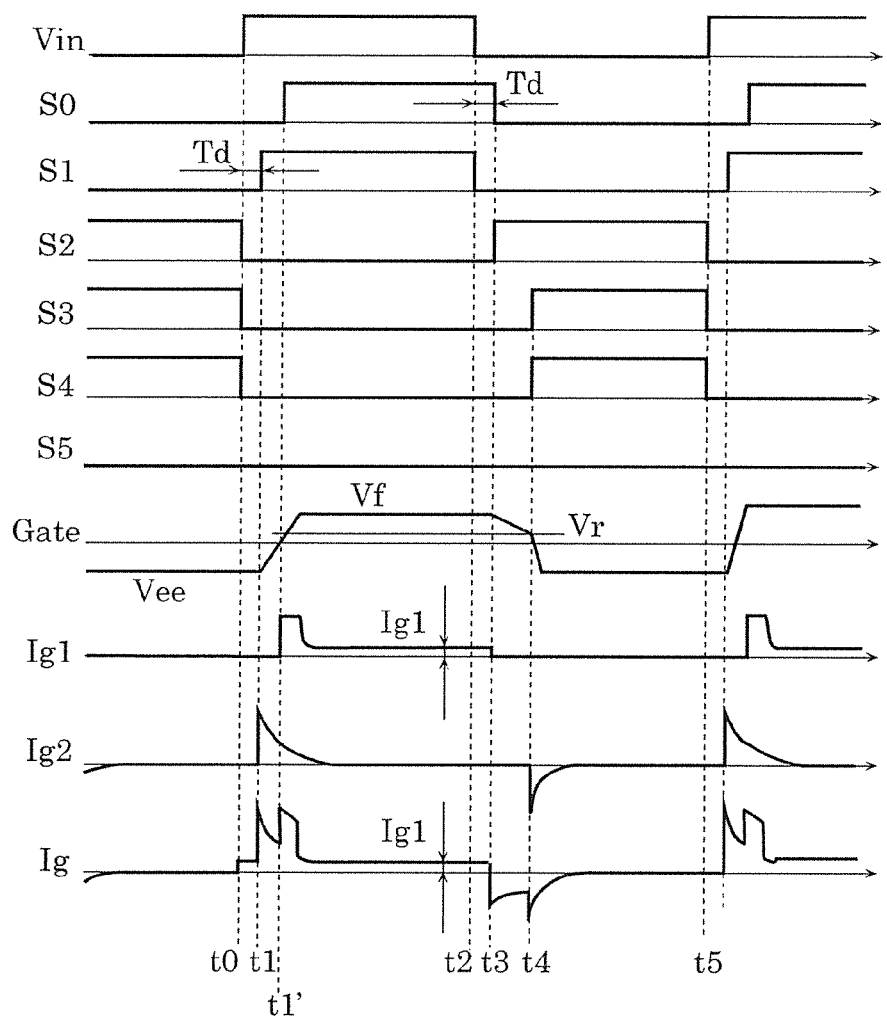
FIG. 9 is a diagram illustrating signal waveforms in the switching device according to Embodiment 3.

FIG. 8 is a diagram illustrating a configuration of driving control circuit 5A according to Embodiment 3. FIG. 9 is a diagram illustrating signal waveforms in a switching device according to Embodiment 3. Driving control circuit 5A illustrated in FIG. 8 differs from driving control circuit 5 illustrated in FIG. 2 in that a signal inverted from an output from comparator 66 by inverter 69 is added as an input to AND circuit 61 modified to have a configuration for receiving three inputs including the added input. Although not illustrated, current supply circuit 10 has a function for supplying a current of several hundreds of mA during a period of several to several hundreds of nsec required to start supply of a current after signal S0 rises, and next supplying a constant current which has been set at a level for stabilizing an ON state of switching element 2 until signal S0 falls.

In the configuration, as illustrated in FIG. 9, when the gate voltage of switching element 2 exceeds reference voltage Vr at time t1' that is after a predetermined period from time t1 delayed from time t0 by delay time Td, an output from comparator 66 is inverted from level "H" to level "L", and an output from inverter 69 is inverted to level "H". In this way, the output from OR circuit 60, the output from AND circuit 57, and the output from inverter 69 which are the three inputs to AND circuit 61 are all set to level "H", and signal S0 which is output from AND circuit 61 is at level "H". At this time, a gate charged current is supplied from current supply circuit 10 so as to add the CR driving path via the first impedance circuit decreased at the time of turn-on. In other words, when the gate-source voltage of switching element 2 reaches or exceeds a predetermined voltage, current Ig1 is output from current supply circuit 10. For this reason, even when a negative voltage bias is applied at the time of turning off switching element 2, fast turn-on can be achieved easily.

Subsequently, current supply circuit 10 supplies a constant current which has been set at a level for stabilizing the ON state of switching element 2. In other words, current supply circuit 10 outputs current Ig1 larger than or equal to a first current value during a predetermined period following the start of output of current Ig2, and outputs current Ig1 having a constant value smaller than the first current value after the elapse of the predetermined period.

Signal S0 is set to level "L" at time t3 that is after delay time Td from time t2 at which input signal Vin fell. At this time, current supply circuit 10 stops operating. The following operations are the same as in Embodiment 1.

In other words, when switching element 2 is put into an ON state, the driver circuit according to this embodiment causes current supply circuit 10 to output current Ig1 after an elapse of a predetermined time following the start of supply of current Ig2 to the gate terminal according to input signal Vin.

According to this embodiment, a gate charged current is supplied from current supply circuit 10, in addition to the first impedance circuit. Thus, even when the absolute value of negative power supply potential Vee is large and the gate capacitance of switching element 2 is large, the gate charged current is added from current supply circuit 10 at the time when the gate voltage reaches the threshold value for turning on switching element 2. Thus, it is possible to achieve fast turn-on.

Embodiment 4

Switching control circuits according to Embodiments 1 and 3 have a configuration in which the CR driving path (first impedance circuit) which allows a surge current for controlling a peak value to pass through in order to charge gate capacitance by applying a large current to the gate only at the time of turning on the switching element(s).

Unlike the above, the switching control circuit and the switching device according to this embodiment differ in the configuration of the first impedance circuit.

Figure 10:
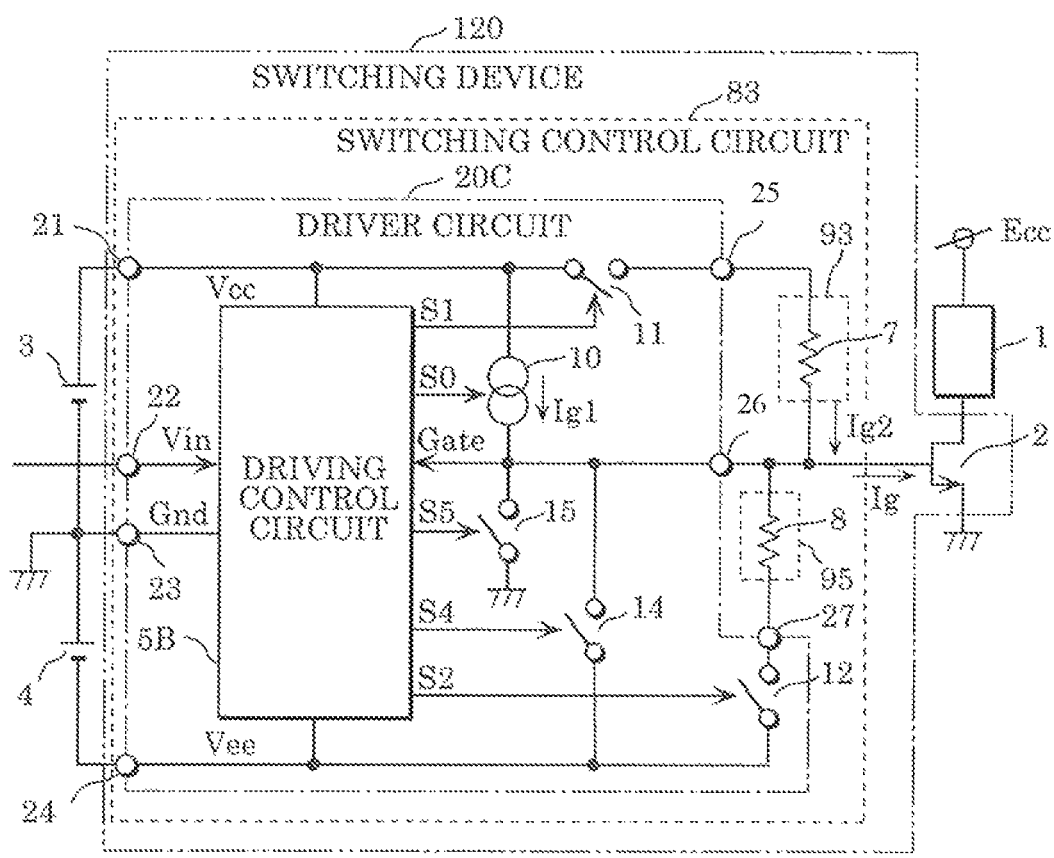
FIG. 10 is a diagram illustrating a load and a circuit configuration of a switching device according to Embodiment 4.
Figure 11:
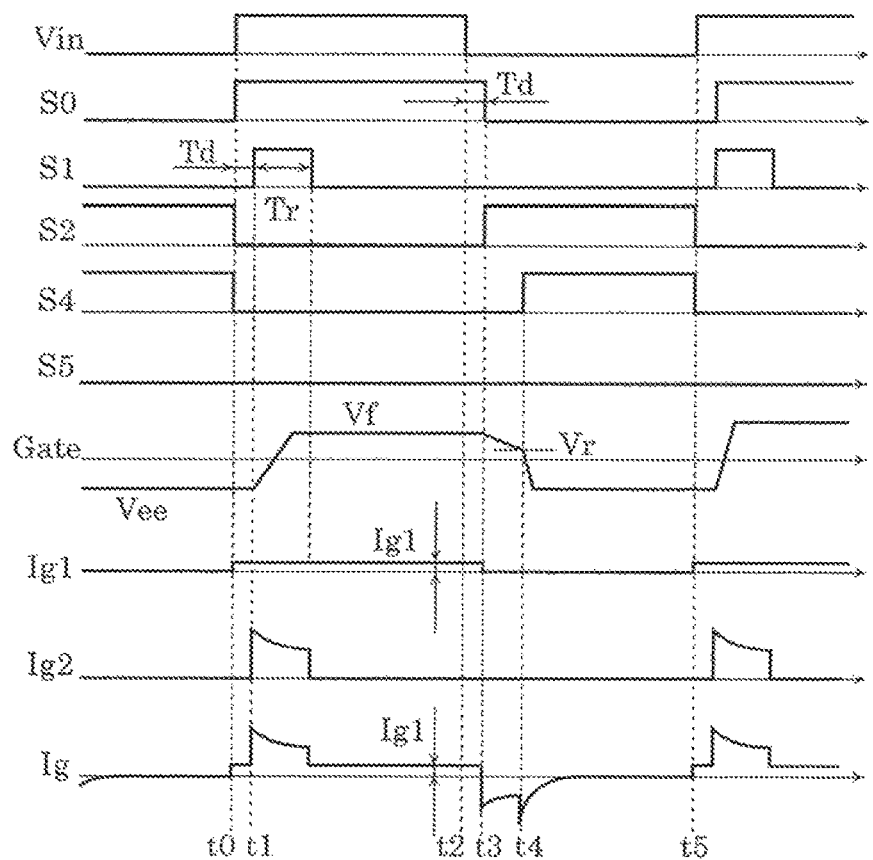
FIG. 11 is a diagram illustrating signal waveforms in the switching device according to Embodiment 4.

FIG. 10 is a diagram illustrating load 1 and a circuit configuration of switching device 120 according to Embodiment 4. FIG. 11 is a diagram illustrating signal waveforms in switching device 120 according to Embodiment 4.

In FIG. 10, switching device 120 includes switching element 2 and switching control circuit 83. Switching control circuit 83 is a circuit which controls an application state of power supply voltage Ecc to load 1, and includes driver circuit 20C, first impedance circuit 93, and second impedance circuit 95. Driver circuit 20C includes: driving control circuit 5B; current supply circuit 10; first switch 11; second switch 12; fourth switch 14; fifth switch 15; positive power supply terminal 21; input terminal 22; ground terminal 23; negative power supply terminal 24; first output terminal 25; second output terminal 26; and third output terminal 27.

Hereinafter, driver circuit 20C, switching control circuit 83, and switching device 120 according to this embodiment are described mainly focusing the differences from driver circuit 20, switching control circuit 80, and switching device 100 according to Embodiment 1 and the same configurations and operations are not described repeatedly.

When a large current for fast charging is applied to the gate terminal only at the time of turning on switching element 2, as illustrated in FIG. 11, signal 51 is designed to be a signal which is at level "H" only during predetermined turn-on period Tr which can be set to correspond to turn-on time starting from time t1. In other words, driver circuit 20C outputs positive voltage Vcc from first output terminal 25 to first impedance circuit 93 only during period Tr which is a beginning part of the period in which switching element 2 is in an ON state. Signal S1 which is at level "H" only during the period drives first switch 11. In this way, it is possible to eliminate the need of condenser 6 included in first impedance circuit 90, third switch 13 for discharge of condenser 6, and signal S3 according to Embodiment 1.

Here, when the gate capacitance is represented as Cgs and gate injected charge required for turn-on is represented as Qg, average gate current Iga required for turning on switching element 2 during turn-on period Tr is represented according to Expression 4.

$$Iga=(Qg-Cgs\times Vee)/Tr \quad (4)$$

In addition, resistance value R7 of first resistor 7 included in first impedance circuit 93 is approximately represented so that average current Iga can be applied only during turn-on period Tr after signal S1 rises.

$$R7\approx(Vcc-Vf/2-Vee/2)/Iga \quad (5)$$

According to this embodiment, average gate current Iga for turning on switching element 2 during turn-on period Tr and resistance value R7 of first resistor 7 included in first impedance circuit 93 are set to satisfy Expressions 4 and 5. In this way, it is possible to adjust transition time and change the voltage and current rates (through rates) at the time of turn-on, and secure a stable ON state indicating a low ON resistivity. In addition, setting a negative power supply sets the gate voltage at the time of turn-off to a negative voltage. In this way, it is possible to prevent erroneous operation such as self turn-on. Furthermore, driving paths of two or more systems (first impedance circuit 93 and second impedance circuit 95) having different resistance values are provided as connection paths to the negative power supply at the time of turn-off. In this way, it is possible to adjust transition time and change the voltage and current rates (through rates) at the time of turn-off. In this way, it is possible to omit condenser 6 included in first impedance circuit 90, third switch 13 for discharge of condenser 6, and signal S3 according to Embodiment 1, and thus to simplify the circuit configuration.

Conclusion

Hereinafter, as described with reference to the drawings, the driver circuits, switching control circuits including the driver circuits, and switching devices including the switching control circuits according to the embodiments control the gate-source voltages of the switching elements and currents input to the gate terminals or currents output from the gate terminals. The driver circuits each have the first current path via the first impedance circuit and the second current path via the current supply circuit as the paths for a current input to the gate terminal when turning on the switching element. With this configuration, it is possible to maintain a stable ON state after the switching element is turned on fast in a controllable turn-on time.

Here, the first impedance circuit may be configured to include a series circuit of a resistive element and a capacitive element. In this way, it is possible to achieve fast turn-on by making an input current at the time of turn-on to be a surge current having a controlled peak value, and to reduce driving losses by preventing the current from inputting into the first current path after the gate voltage is fixed and by allowing the current to input to only the second current path. Furthermore, securing the path for discharging capacitive element in the first impedance circuit when turning off the switching element makes an initial voltage of the capacitive element at the time of turn-on to be constant, which further facilitates control of the input current.

In addition, the gate-source voltage which reaches or exceeds a predetermined voltage may be allowed to pass through the second current path after the first current path is made conductive first. Furthermore, the current supply circuit may supply a current having a first current value or above during a predetermined period from the start of conduction of the second current path in a conduction period, and may supply a predetermined constant current having a first current value or below during the remaining conduction period. In this way, it is possible to further increase an input current when the gate voltage reaches the threshold value for turn-on to further reduce turn-on time.

In addition, it is possible to prevent an erroneous operation due to a self turn-on phenomenon by configuring the current supply circuit to include the negative power supply circuit which generates a negative voltage to be a potential lower than that of the source terminal and to apply a negative voltage between the gate and the source when turning off the switching element. Here, a negative voltage may be generated by causing an inverse type switched capacitor converter to perform positive-negative inversion on a voltage obtained by means of a series regulator reducing and stabilizing a power supply voltage. In this way, the voltage can be stabilized.

Furthermore, it is possible to include, as paths for a current output from the gate terminal, a third current path connected to the negative power supply circuit via the second impedance circuit and a fourth current path connected to the negative power supply circuit at an impedance lower than that of the second impedance circuit, and to make the fourth current path conductive when the gate-source voltage decreases to a predetermined voltage or below after making the third current path conductive first when turning off the switching element. In this way, it is possible to achieve fast turn-on in a controllable turn-off time by controlling the output current at the time of turn-off.

In addition, it is possible to configure the first impedance circuit only with a predetermined resistive element, and make the first current path conductive only during predetermined time when turning on the switching element. This configuration further eliminates the need to include a capacitive element and a discharge path for the capacitive element. Thus, the circuit configuration can be simplified.

Other Embodiments

Although the driver circuit, the switching control circuit, and the switching device according to the embodiments of the present disclosure have been described above, the present disclosure is not limited to Embodiments 1 to 4 described above.

In addition, any of the driver circuits according to the embodiments above may be typically implemented as a large scale integration (LSI) which is an integrated circuit. The respective processing units of each driver circuit may be made as individual chips, or some or all of the processing units may be integrated into one chip.

Moreover, ways to achieve integration are not limited to the LSI, and a special circuit or a general purpose processor and so forth can also achieve the integration. Field Programmable Gate Array (FPGA) that can be programmed after manufacturing an LSI or a reconfigurable processor that allows re-configuration of the connection or configuration of an LSI can be used for the same purpose.

In addition, at least part of functions of the driver circuit, the switching control circuit, and the switching device according to Embodiments 1 to 4 may be arbitrarily combined.

In addition, all of the numerals used above are examples for specifically illustrating the present disclosure, and the present disclosure is not limited to the exemplary numerals. Furthermore, the logic levels represented as level H/level L or the switching states represented as ON/OFF are examples for specifically illustrating the present disclosure. Thus, other combinations each having a logic level and/or a switching state different from those in the examples can also achieve an equivalent result.

In addition, materials for the respective constituent elements described above are examples for specifically illustrating the present disclosure, and thus the present disclosure is not limited to the exemplary materials. In addition, the connection relationships between the constituent elements are examples for specifically illustrating the present disclosure, and thus the connection relationships for achieving the functions of the present disclosure are not limited to the exemplary connection relationships.

Furthermore, the present disclosure covers various kinds of variations obtainable by adding modifications to any of the embodiments within a range conceivable by any person skilled in the art.

INDUSTRIAL APPLICABILITY

The present disclosure is applicable to semiconductor switching circuits including semiconductor switching elements, modules etc. using the semiconductor switching circuits.

What is claimed is:

1. A driver circuit which is supplied with a positive power supply voltage, a negative power supply voltage, and an input signal, and drives a switching element including a control terminal according to the input signal, the driver circuit comprising:
a first output terminal which is connected to the control terminal via a first impedance circuit, and outputs the positive power supply voltage or the negative power supply voltage according to the input signal, to charge the control terminal and put the switching element into an ON state;
a negative power supply terminal which is supplied with the negative power supply voltage;
a negative voltage switch having a first end connected to the negative power supply terminal;
a third output terminal which is connected to a second end of the negative voltage switch, and connected to the control terminal via a second impedance circuit;
a first discharge switch disposed between the negative power supply terminal and the first output terminal;
a current supply circuit; and
a second output terminal connected to the current supply circuit, the second output terminal being different from the first output terminal,
wherein the driver circuit puts the switching element into an ON state by supplying, to the control terminal, a first current converted from the positive power supply voltage output from the first output terminal by the first impedance circuit and a second current which is output from the current supply circuit via the second output terminal.

2. The driver circuit according to claim 1, wherein at least one of the negative voltage switch and the first discharge switch is put into a conduction state according to the input signal, and the switching element is put into an OFF state by discharging a current from the control terminal.

3. The driver circuit according to claim 1, wherein the driver circuit causes the current supply circuit to output the second current after an elapse of predetermined time following a start of supply of the first current to the control terminal according to the input signal when putting the switching element into an ON state.

4. The driver circuit according to claim 1,
wherein the switching element;
includes the control terminal, a first terminal, and a second terminal; and
causes the current supply circuit to output the second current when a voltage between the control terminal and the second terminal of the switching element reaches or exceeds a predetermined voltage.

5. The driver circuit according to claim 1, wherein the current supply circuit outputs the second current which has a current value larger than or equal to a first current value during a predetermined period after a start of output of the second current, and outputs the second current which has a constant current value smaller than the first current value after an elapse of the predetermined period.

6. The driver circuit according to claim 1, wherein the driver circuit drives the switching element by supplying the first current and the second current to the control terminal of the switching element of a voltage application—current driven type.

7. The driver circuit according to claim 1, wherein the driver circuit drives the switching element by supplying the first current and the second current to the control terminal of the switching element which is a gate injection transistor made using gallium nitride (GaN-GIT).

8. The driver circuit according to claim 1, further comprising a discharge switch which is connected to the negative power supply terminal and at least one of the second output terminal and the control terminal, the discharge switch being for discharging charge accumulated in the first impedance circuit by being put into a conduction state when the switching element is put into an OFF state.

9. The driver circuit according to claim 1,
wherein a positive power supply terminal is supplied with the positive power supply voltage,
a negative power supply which supplies the negative power supply voltage to the negative power supply terminal includes:

a series regulator which is connected to the positive power supply terminal, and outputs a voltage obtained by reducing and stabilizing the positive power supply voltage; and an inverse type switched capacitor converter which inverts an output from the series regulator to generate the negative voltage.

10. The driver circuit according to claim 1, further comprising:

a positive power supply terminal supplied with the positive power supply voltage; and at least part of:

a series regulator which is connected to the positive power supply terminal, and outputs a voltage obtained by reducing and stabilizing the positive power supply voltage; and an inverse type switched capacitor convertor which inverses an output from the series regulator to generate the negative power supply voltage.

11. A switching control circuit which is supplied with a positive power supply voltage and an input signal, and drives a switching element including a control terminal according to the input signal, the switching control circuit comprising:

a first impedance circuit including a predetermined resistive element; and a current supply circuit, wherein the switching control circuit controls the switching element by supplying, to the control terminal, a first current converted from the positive power supply voltage by the first impedance circuit and a second current which is output from the current supply circuit when putting the switching element into an ON state, and wherein the switching control circuit is supplied with a negative power supply voltage, the switching control circuit further comprising:

a first output terminal which is connected to the control terminal via the first impedance circuit, and outputs the positive power supply voltage according to the input signal, to charge the control terminal and put the switching element into an ON state;

a second impedance circuit including a predetermined resistive element;

a negative power supply terminal which is supplied with the negative power supply voltage;

a negative voltage switch having a first end connected to the negative voltage supply terminal and a second end connected to the control terminal via the second impedance circuit;

a first discharge switch having a first end connected to the negative power supply terminal and a second end connected to the first output terminal; and a second discharge switch having a first end connected to the negative power supply terminal and a second end directly connected to the control terminal.

12. The switching control circuit according to claim 11, when putting the switching element into an OFF state, the switching control circuit putting at least one of the negative voltage switch, the first discharge switch, and the second discharge switch into a conduction state to discharge the control terminal.

13. The switching control circuit according to claim 11, wherein the first impedance circuit includes a circuit to which the predetermined resistive element and a capacitive element are connected in series.

14. The switching control circuit according to claim 11, wherein the switching control circuit controls the switching element by supplying the first current and the second current to the control terminal of the switching element of a voltage application—current driven type.

15. The switching control circuit according to claim 11, wherein the switching control circuit controls the switching element by supplying the first current and the second current to the control terminal of the switching element which is a gate injection transistor made using gallium nitride (GaN-GIT).

16. A switching control circuit which is supplied with a power supply voltage and an input signal, the switching control circuit controlling two switching elements according to the input signal, the two switching elements being a first switching element and a second switching element each including a first terminal, a second terminal, and a control terminal, the first terminal of the first switching element being connected to a power supply, the second terminal of the second switching element being grounded, and the second terminal of the first switching element being connected to the first terminal of the second switching element, the switching control circuit comprising:

the switching control circuit according to claim 11 which is a first switching control circuit that controls the first switching element; and the switching control circuit according to claim 11 which is a second switching control circuit that controls the second switching element, wherein the first switching control circuit and the second switching control circuit alternately turn on and off the first switching element and the second switching element, respectively.

17. A switching device, comprising:

the switching control circuit according to claim 11; and the switching element.

* * * * *